United States Patent [19]
Gilliam et al.

[11] Patent Number: 5,920,516
[45] Date of Patent: Jul. 6, 1999

[54] CIRCUIT AND METHOD FOR ENABLING A FUNCTION IN A MULTIPLE MEMORY DEVICE MODULE

[75] Inventors: Gary R. Gilliam; Kevin G. Duesman; Leland R. Nevill, all of Boise, Id.

[73] Assignee: Micron Technology, Inc., Boise, Id.

[ * ] Notice: This patent is subject to a terminal disclaimer.

[21] Appl. No.: 09/042,129

[22] Filed: Mar. 12, 1998

Related U.S. Application Data

[63] Continuation of application No. 08/577,840, Dec. 22, 1995, Pat. No. 5,825,697.

[51] Int. Cl.⁶ ........................................... G11C 7/00
[52] U.S. Cl. .................................. 365/200; 365/225.7
[58] Field of Search .............................. 365/200, 225.7, 365/230.03

[56] References Cited

U.S. PATENT DOCUMENTS

| | | | |
|---|---|---|---|
| 3,668,644 | 6/1972 | Looschen | 365/200 |
| 5,110,754 | 5/1992 | Lowrey et al. | 437/52 |
| 5,126,971 | 6/1992 | Lin et al. | 365/171 |
| 5,161,157 | 11/1992 | Owen et al. | 371/10.2 |
| 5,241,496 | 8/1993 | Lowrey et al. | 365/96 |
| 5,257,229 | 10/1993 | McClure et al. | 365/200 |
| 5,301,143 | 4/1994 | Ohri et al. | 365/96 |
| 5,355,340 | 10/1994 | Coker et al. | 365/200 |
| 5,406,520 | 4/1995 | Tay | 365/200 |
| 5,412,593 | 5/1995 | Magel et al. | 365/96 |
| 5,566,107 | 10/1996 | Gilliam | 365/200 |
| 5,576,999 | 11/1996 | Kim et al. | 365/200 |
| 5,761,145 | 6/1998 | Zagar et al. | 365/200 |
| 5,764,574 | 6/1998 | Nevill et al. | 365/200 |
| 5,825,697 | 10/1998 | Gilliam et al. | 365/200 |

*Primary Examiner*—Trong Phan
*Attorney, Agent, or Firm*—Seed and Berry LLP

[57] ABSTRACT

A memory device module in a package having externally accessible contacts includes multiple integrated memory circuits accessible to external circuitry exclusively through the contacts. An accessing circuit for each memory circuit accesses memory cells in the memory circuit for communication with the external circuitry. Each accessing circuit can be enabled to access redundant memory cells instead of inoperative memory cells by an enabling signal. An enabling circuit for each accessing circuit can output the enabling signal in response to receiving a unique set of input signals from external circuitry. Each unique set is selected with fuses in each enabling circuit, and includes row and column address strobe signals and a data signal. Upon receiving its unique set, one of the enabling circuits advantageously enables its associated accessing circuit to access redundant memory cells without the accessing circuits of the other memory circuits also being so enabled.

18 Claims, 5 Drawing Sheets

CIRCUIT AND METHOD FOR ENABLING A FUNCTION IN A MULTIPLE MEMORY DEVICE MODULE

CROSS-REFERENCE TO RELATED APPLICATION

This application is a continuation of pending U.S. patent application Ser. No. 08/577,840, filed Dec. 22, 1995, which is now U.S. Pat. No. 5,825,697.

FIELD OF THE INVENTION

This invention relates in general to integrated memory circuits, and in particular to circuits and methods for enabling function circuits such as redundant memory cells in integrated memory circuits.

BACKGROUND OF THE INVENTION

In conventional memories, multiple integrated memory circuits are sometimes packaged together in a module referred to as a multiple memory device module. For example, multiple integrated memory circuits implemented on one or more dies can be packaged together in a multiple memory device module such as a single in-line memory module (SIMM), a dual in-line memory module (DIMM) and a multi-chip memory module (MCM). Of course, other package types also work.

Each integrated memory circuit in a multiple memory device module typically has one or more optional function circuits which can be enabled if necessary. For example, a redundant memory cell in an integrated memory circuit can be enabled to replace an inoperable memory cell having an address which is typically determined during the manufacturing process. Another typical optional function circuit allows for fine tuning of the component values of circuit elements such as resistors and capacitors in an integrated memory circuit. These redundant memory elements or other optional function circuits are typically enabled by opening laser fuses or shorting anti-fuses. For this reason, the redundant elements or function circuits are generally enabled at the chip level before the chip has been placed in a module. If a defect is found in a memory chip once the chip has been placed in a module, either the memory chip must be removed from the module for enabling the redundant elements or function circuits or the redundant elements or function circuits must be enabled for all chips on the module. For these reasons, memory device repair and the selection of optional functions once memory chips have been assembled together in a module has not been feasible for individual memory chips.

One approach to enabling a function circuit in an integrated memory circuit packaged along with other integrated memory circuits in a multiple memory device module might be to apply a high voltage to one of the input terminals of the module. The high voltage would then generally be strobed into the module with an address strobe signal such as CAS, and would be applied to each integrated memory circuit in the module which shares the same address strobe signal. Within each integrated memory circuit receiving the high voltage, programmable elements, such as anti-fuses, would be blown by the high voltage to enable the desired function circuit.

Thus, for example, if the high voltage was applied to the inputs of a multiple memory device module receiving both a CAS1 signal and a CAS2 signal, and the high voltage was then strobed into the module with the CAS1 signal, then the high voltage would be applied to each integrated memory circuit in the module which shares the CAS1 signal. As a result, the desired function circuit would be enabled in each integrated memory circuit which shares the CAS1 signal. Of course, the CAS1 signal could only go to one integrated memory circuit, in which case only the desired function circuit in that integrated memory circuit would be enabled.

For the above reasons, it does not appear to be possible to enable a desired function circuit in only one integrated memory circuit in a multiple memory device module. In a typical multiple memory device module, each integrated memory circuit has its own memory array which includes memory cells arranged in rows and columns and associated redundant memory cells typically arranged in rows. If a memory cell in a row in one of the integrated memory circuits is inoperable, then the above-described approach to repairing the inoperable memory cell would be to replace the row it is in with an associated row of redundant memory cells. At the same time, however, this approach would also replace operable memory cells in the other integrated memory circuits in the multiple memory device module with their associated rows of redundant memory cells. Consequently, in a multiple memory device module having two integrated memory circuits which share the same CAS signal, a row in one of the integrated memory circuits would be replaced with an associated redundant row despite the fact that the replaced row is not faulty.

This inability to isolate a faulty row in a single integrated memory circuit in a multiple memory device module for replacement would reduce the rate of success for repairing multiple memory device modules, since each repair would cause many operable standard memory cells to be unnecessarily replaced. Thus, for example, in a multiple memory device module having eight integrated memory circuits, repairing one inoperable standard memory cell would result in the replacement of one row of standard memory cells in each of the eight integrated memory circuits with an associated redundant row. If there is a 99% chance associated with each redundant row that it does not contain an inoperable memory cell, then there is a $(0.99^8)$ or only a 92% chance that all eight redundant rows do not contain inoperable memory cells. During a typical manufacturing run of thousands of multiple memory device modules, the difference between a 99% rate of successful repair and a 92% rate is obviously of great significance.

Therefore, there is a need in the art for a circuit and method for advantageously enabling a function circuit, such as a redundant memory cell, in only one of the integrated memory circuits in a multiple memory device module. Such a circuit and method should, when used to repair multiple memory device modules with inoperable standard memory cells, provide an increased rate of successful repair.

SUMMARY OF THE INVENTION

An inventive memory device module has a plurality of integrated memory circuits each operatively coupled to a communication coupler in the package for communicating with circuitry external to the package. Each integrated memory circuit receives a plurality of input signals including at least one address strobe signal, addresses, and other input signals from external circuitry. The inputs may be received through externally accessible contacts, or from a contactless interface such as a radio frequency or optical signal interface. The module also includes an enabling circuit, preferably including a NAND gate, corresponding to each of the integrated memory circuits. Each enabling circuit is operatively coupled to its respective integrated memory circuit to receive at least some of the input signals. Each enabling circuit is uniquely responsive to a corresponding set of the input signals by outputting an enabling signal. Each set includes at least one of the other input signals. The module further includes a function circuit corresponding to each of the enabling circuits. Each function circuit is enabled by receiving an enabling signal from its respective enabling circuit. Preferably, the function circuits are redundant memory cells.

In this manner, the respective function circuit of one of the integrated memory circuits is advantageously enabled without the respective function circuits of the other integrated memory circuits being enabled.

DETAILED DESCRIPTION OF THE INVENTION

Figure 1:
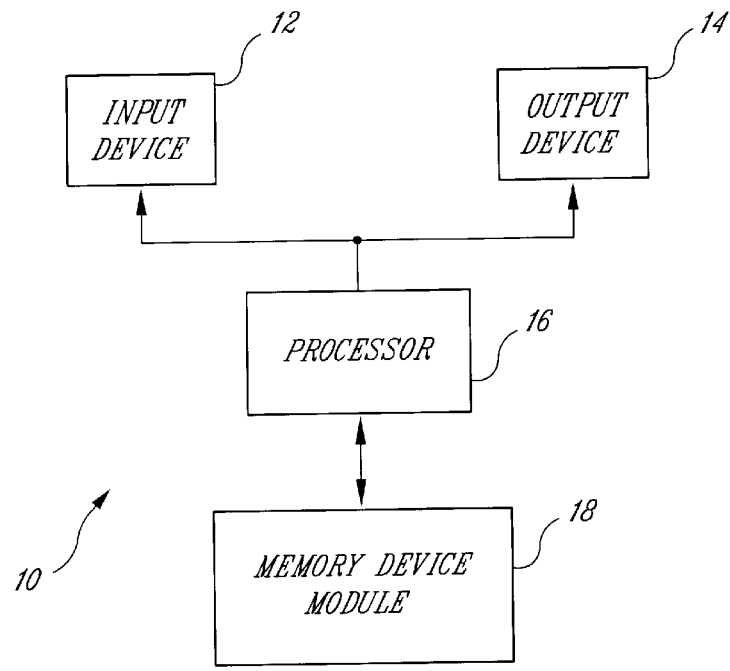
FIG. 1 is a block diagram of a preferred computer system according to the present invention including a memory device module.

In a preferred embodiment of the present invention shown in FIG. 1, a computer system 10 includes an input device 12, such as a keyboard, and an output device 14, such as a CRT monitor, both of which are operatively coupled to a conventional processor 16. The computer system 10 further includes a multiple memory device module 18 operatively coupled to the processor 16. It will be understood by those with skill in the field of this invention that the present invention is applicable to any multiple memory device module, including those that comprise dynamic random access memories (DRAMs) or static random access memories (SRAMs).

Figure 2:
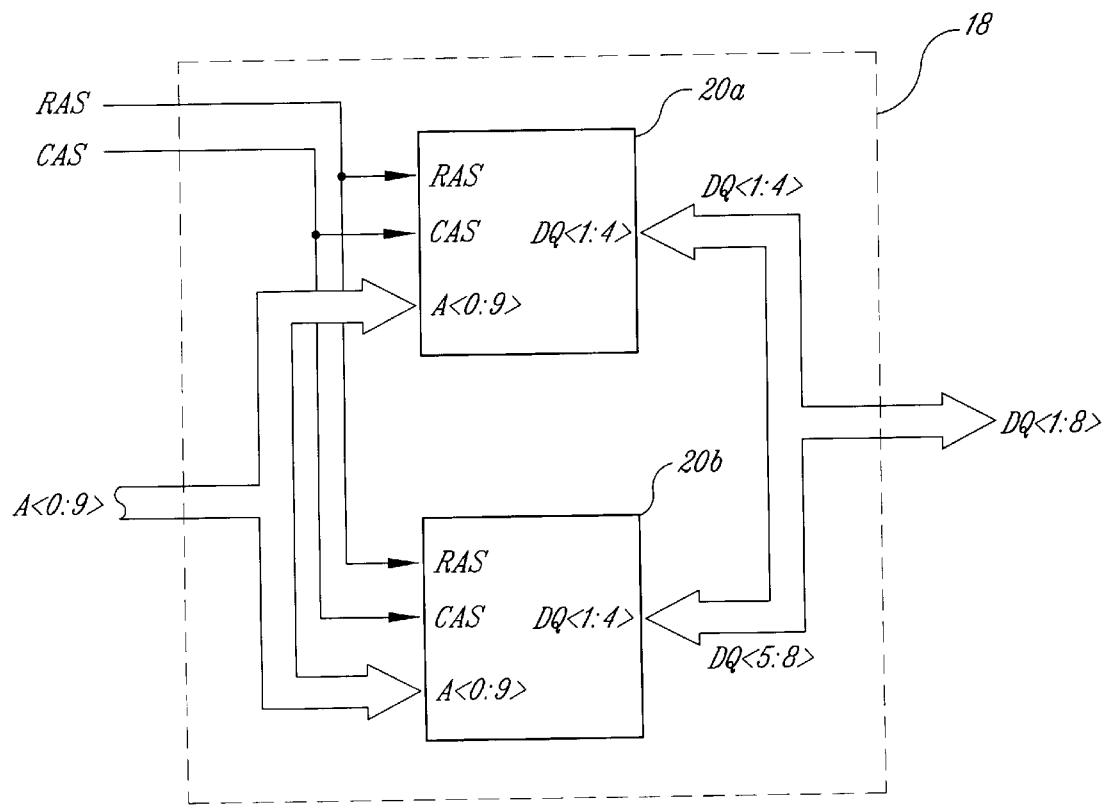
FIG. 2 is a block diagram of the memory device module of FIG. 1 including integrated memory circuits.

One embodiment of the memory device module 18 of FIG. 1 is shown in more detail in FIG. 2. It includes a plurality of integrated memory circuits 20a and 20b operatively coupled to the processor 16 (not shown) to receive address strobe signals RAS and CAS and addresses A<0:9> from the processor 16 (not shown), and to transfer data signals DQ<1:8> to and from the processor 16 (not shown).

Figure 3:
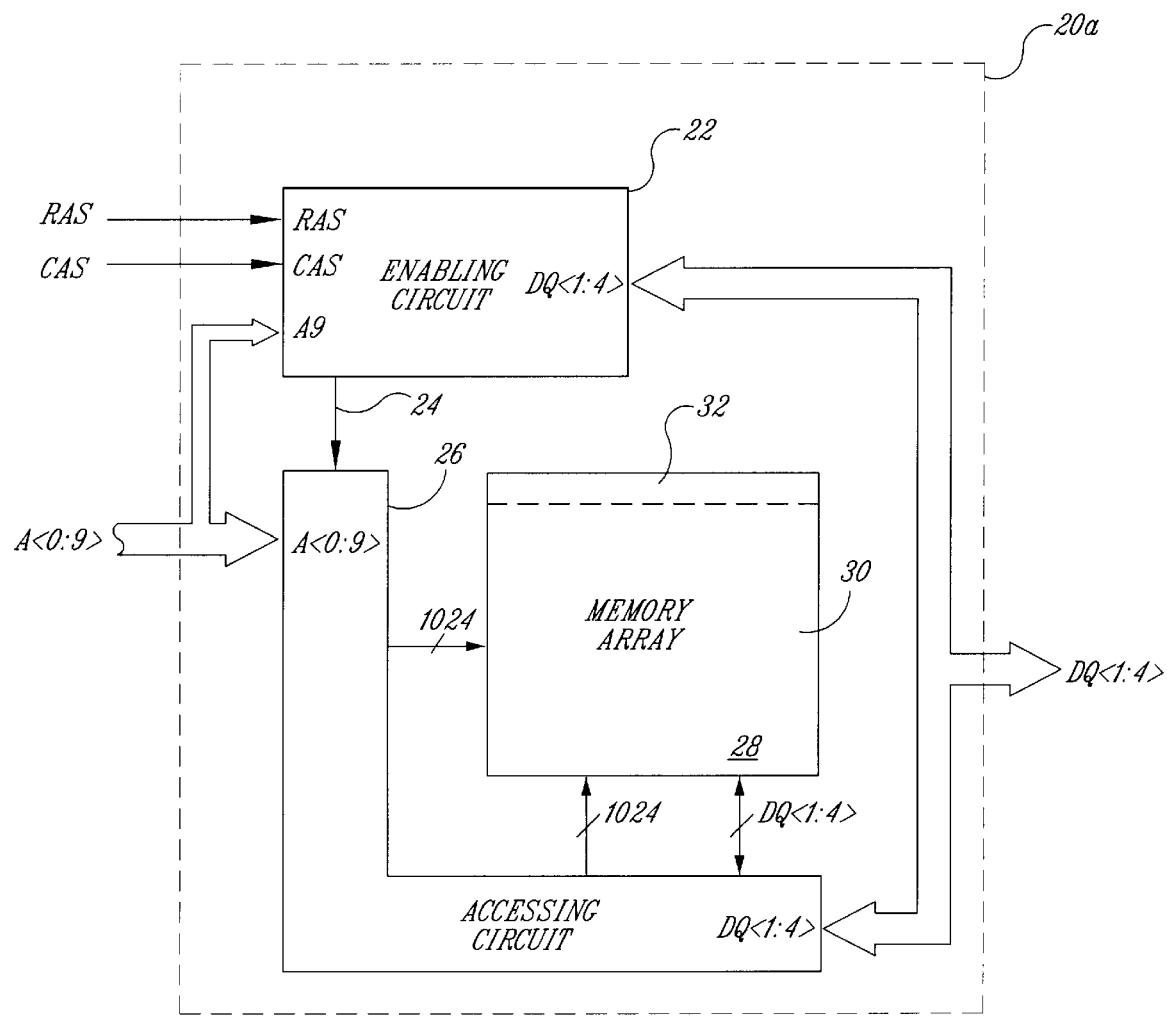
FIG. 3 is a block diagram of one of the integrated memory circuits of FIG. 2 including an enabling circuit.

One of the integrated memory circuits 20a of FIG. 2 is shown in more detail in FIG. 3. It includes an enabling circuit 22 which provides an enabling signal 24 in response to receiving a set of signals which is unique to the enabling circuit 22. Preferably, the enabling circuit 22 is uniquely responsive to receiving a set of signals including the address strobe signals RAS and CAS, the A9 bit of the address and a data signal such as DQ1. Of course, the set of signals could also include any one of the data signals DQ<2:4> instead of DQ1, but it will be understood that the set of signals does not have to include RAS, CAS, or any one of the data signals DQ<1:4>. Likewise, an identical enabling circuit in the other integrated memory circuit 20b (not shown) is preferably uniquely responsive to receiving a set of signals which includes the address strobe signals RAS and CAS and a data signal such as DQ5 (not shown in FIG. 3) by also providing an enabling signal. Of course, the set of signals could include any one of the data signals DQ<6:8> (not shown in FIG. 3) instead of DQ5, but does not have to include RAS, CAS, or any of the data signals DQ<5:8> (not shown in FIG. 3). In this manner, either enabling circuit can be uniquely identified and caused to provide its enabling signal if desired. The enabling circuit 22 will be described in more detail below with respect to FIGS. 4, 5 and 6.

An accessing circuit 26 receives the enabling signal 24. The accessing circuit 26 includes row and column decoders, data buffers, and sense amplifiers, and is coupled to a memory array 28 by 1024 row enable lines, 1024 column enable lines, and a 4-bit data bus. The memory array 28 includes both memory cells 30 and redundant memory cells 32. The accessing circuit 26 can access memory cells 30 selected according to a received address A<0:9> for writing or reading data signals DQ<1:4> to or from the memory cells 30, respectively.

The accessing circuit 26 may be programmed upon receipt of the enabling signal 24 and a received address A<0:9> corresponding to a memory cell 30 known to be inoperable to access one of the redundant memory cells 32 instead of the inoperable memory cell 30 when it receives the address A<0:9> of the inoperable memory cell 30. The accessing circuit 26 may be programmed by blowing fuses or anti-fuses to disable accessing of the inoperable memory cell 30 and to enable accessing of the redundant memory cell 32. The anti-fuses may be blown with a high voltage, such as 12 volts, received on an address signal line, such as A8. Although the present invention is described with reference to enabling a redundant memory cell, it will be understood that the claims are not limited to redundant memory cells, but rather include within their scope any function circuit in an integrated memory circuit which it is desirable to enable.

Figure 4:
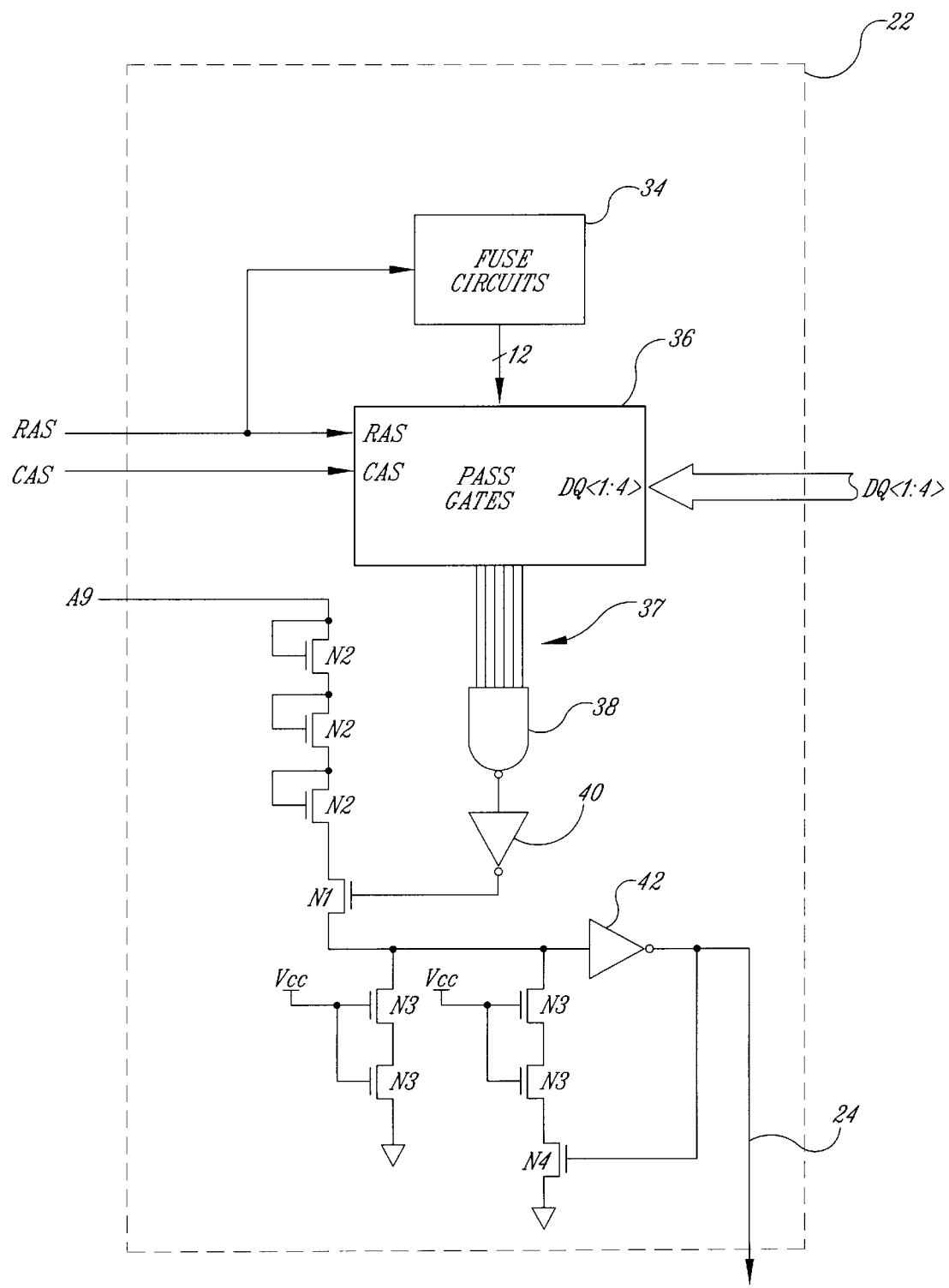
FIG. 4 is a block, schematic and logic diagram of the enabling circuit of FIG. 3 including fuse circuits and pass gates.

One embodiment of the enabling circuit 22 of FIG. 3 is shown in more detail in FIG. 4. It includes a plurality of fuse circuits 34 providing output signals to a plurality of pass gates 36 when it is interrogated by receiving a row address strobe RAS signal. Each of the fuse circuits 34 is associated with one of the input signals such as RAS, CAS and DQ<1:4>. Preferably, each of the fuse circuits 34 includes a metal or polysilicon fuse which can be blown by a laser during manufacturing to cause each of the fuse circuits 34 to provide an output signal to enable the input signal associated with a respective one of the fuse circuits 34 to be one of the signals in the set of signals to which the enabling circuit 22 is uniquely responsive. Of course, each fuse circuit 34 could alternatively include electrically programmable fuses or anti-fuses. The fuse circuits 34 will be described in more detail below with respect to FIG. 5.

Each of the pass gates 36 is also associated with one of the input signals such as RAS, CAS and DQ<1:4>, and each of the pass gates 36 receives the output signal of a respective one of the fuse circuits 34 associated with the same input signal. Each of the pass gates 36 is adapted to enable its associated input signal as one of the signals in the set of signals of the enabling circuit 22 upon receiving an output signal from a corresponding one of the fuse circuits 34. As a result, the input signals in the set of signals used to uniquely identify the integrated memory circuit 20a (not shown) can be selected during manufacturing by blowing the fuse circuits 34 associated with the desired input signals. The pass gates 36 will be described in more detail below with respect to FIG. 6.

The pass gates 36 provide inputs 37 to a NAND gate 38. Some of these inputs 37 are permanently enabled by the pass gates 36, and are thus high. The rest of the inputs 37 are the signals selected by the fuse circuits 34 to be in the set of signals to which the enabling circuit 22 is uniquely responsive. Thus, for example, if the fuse circuits 34 are blown so as to provide output signals to the pass gates 36 which cause the pass gates 36 to enable the input signals RAS, CAS and DQ1 as signals in the set of signals of the enabling circuit 22, then the NAND gate 38 receives RAS, CAS, DQ1 and three permanently high signals as its inputs 37.

In an alternate embodiment, a fixed set of input signals may be 30 selected such as the RAS, CAS and DQ1 combination described above. In this case, the fuse circuits 34 and pass gates 36 are not required, and NAND gate 38 may be a three input NAND gate which receives the RAS, CAS and DQ1 signals. For memory modules where each memory integrated circuit receives a unique combination of RAS, CAS and DQ1, the enabling circuit of each memory integrated circuit may be uniquely addressed. A unique combination of RAS, CAS and DQ1 signals will result when each memory integrated circuit DQ pin is uniquely coupled to a module data pin. In the memory module of FIG. 2, for example, the DQ1 input of memory device 20a is coupled to data bus signal DQ1 and the DQ1 input of memory device 20b is coupled to data bus signal DQ5. A unique combination will also exist when there are multiple RAS or CAS signals and a unique RAS and CAS combination is used whenever the DQ1 input of two memory integrated circuits are coupled to a common module data pin.

In operation, when RAS, CAS and DQ1 all go high, then the output of the NAND gate 38 goes low. As a result, the output of an inverter 40 goes high and turns on an NMOS transistor N1. A high value on an address bit A9 turns on diode-connected NMOS transistors N2, and a high value is then applied as an input to an inverter 42. The output of the inverter 42 then goes low and the enabling signal 24 consequently goes low. At the same time, the low output of the inverter 42 turns off an NMOS transistor N4 and thus provides hysteresis by disabling one of the two pull down paths for the input of the inverter 42.

When either RAS, CAS or DQ1 goes low, the output of the NAND gate 38 goes high and the output of the inverter 40 goes low. As a result, the NMOS transistor N1 turns off and the NMOS transistors N3 pull the input of the inverter 42 low. The output of the inverter 42 and the enabling signal 24 then go high, causing the NMOS transistor N4 to turn on to provide hysteresis through the NMOS transistors N3 by helping to pull the input of the inverter 42 low.

Figure 5:
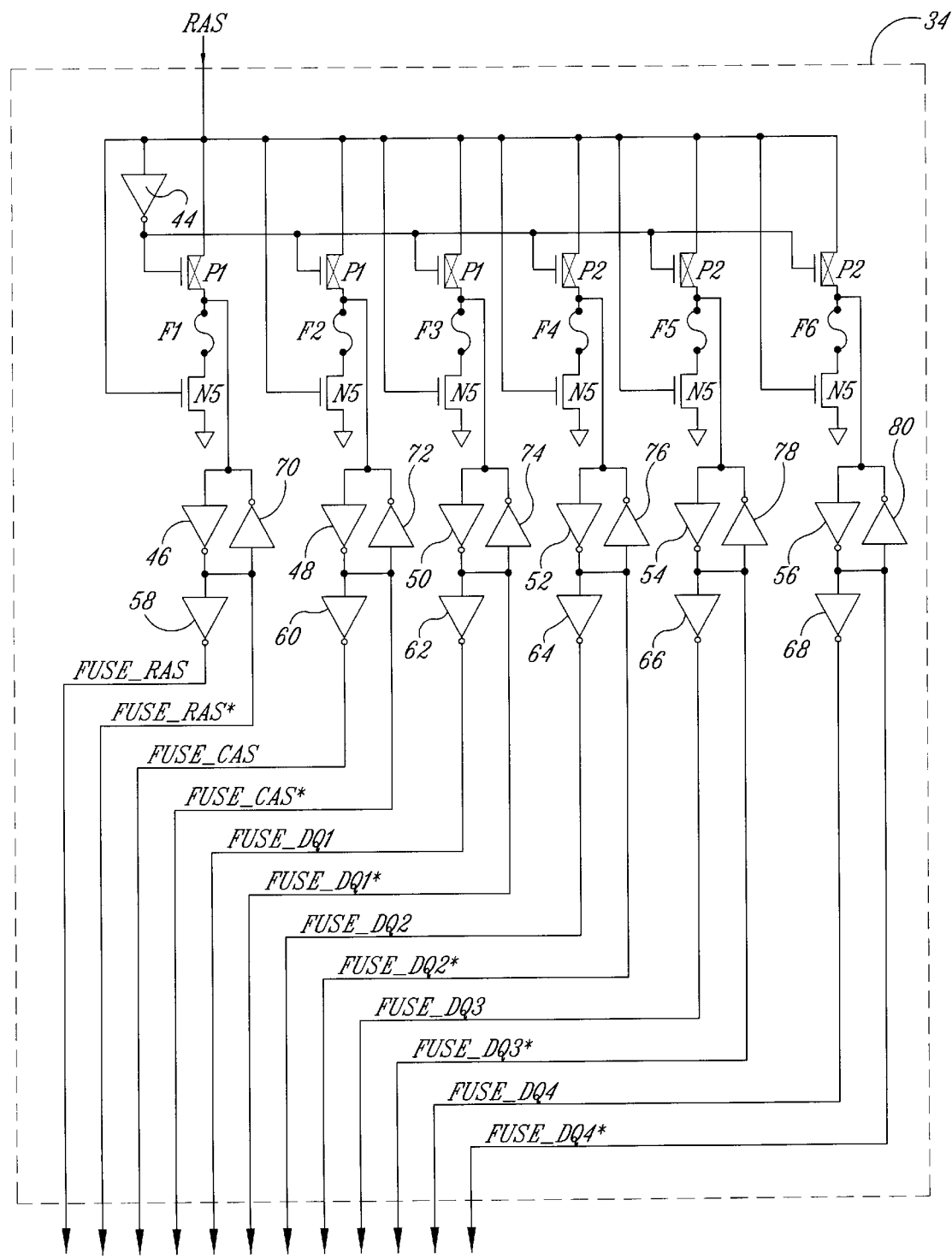
FIG. 5 is a schematic diagram of the fuse circuits of FIG. 4.

The fuse circuits 34 of FIG. 4 are shown in more detail in FIG. 5. In operation, a control signal, which may be RAS, is applied at the gates of NMOS transistors N5 to turn them on. At the same time, an inverter 44 receives the control signal at its input and provides a low voltage at its output to the gates of PMOS transistors P1 and P2, which turn on as a result. In this condition, the inputs to inverters 46, 48, 50, 52, 54 and 56 are low because of the relative W/L ratios of transistors N5, P1 and P2. As a result, the outputs of the inverters 46, 48, 50, 52, 54 and 56 go high, causing the outputs of inverters 58, 60, 62, 64, 66 and 68, and output signals FUSE_RAS, FUSE_CAS, FUSE_DQ1, FUSE_DQ2, FUSE_DQ3 and FUSE_DQ4, to go low. At the same time, the high output of the inverters 46, 48, 50, 52, 54 and 56 causes output signals FUSE_RAS*, FUSE_CAS*, FUSE_DQ1*, FUSE_DQ2*, FUSE_DQ3* and FUSE_DQ4* to go high, and causes the outputs of inverters 70, 72, 74, 76, 78 and 80 to go low to provide hysteresis by helping to pull the inputs to the inverters 46, 48, 50, 52, 54 and 56 low.

In order, for example, to enable input signals RAS, CAS and DQ1 as the set of signals to which the enabling circuit 22 (not shown) is uniquely responsive, fuses or antifuses F1, F2 and F3 are blown during manufacturing while fuses F4, F5 and F6 are left intact. When the fuses or antifuses F1, F2 and F3 are blown, and RAS is applied, the PMOS transistors P1 pull the inputs to the inverters 46, 48 and 50 high (since the fuses or antifuses F1, F2 and F3 no longer provide a path to ground through the transistors N5), causing the outputs of these inverters to go low. As a result, the output signals FUSE_RAS*, FUSE_CAS* and FUSE_DQ1* also go low. The low outputs of the inverters 46, 48 and 50 applied to the inputs of the inverters 70, 72 and 74 causes their outputs to go high, thereby providing hysteresis by helping the PMOS transistors P1 pull their drains high. At the same time, the low outputs of inverters 46, 48 and 50 cause the outputs of inverters 58, 60 and 62, and the output signals FUSE_RAS, FUSE_CAS and FUSE_DQ1, to go high.

Figure 6:
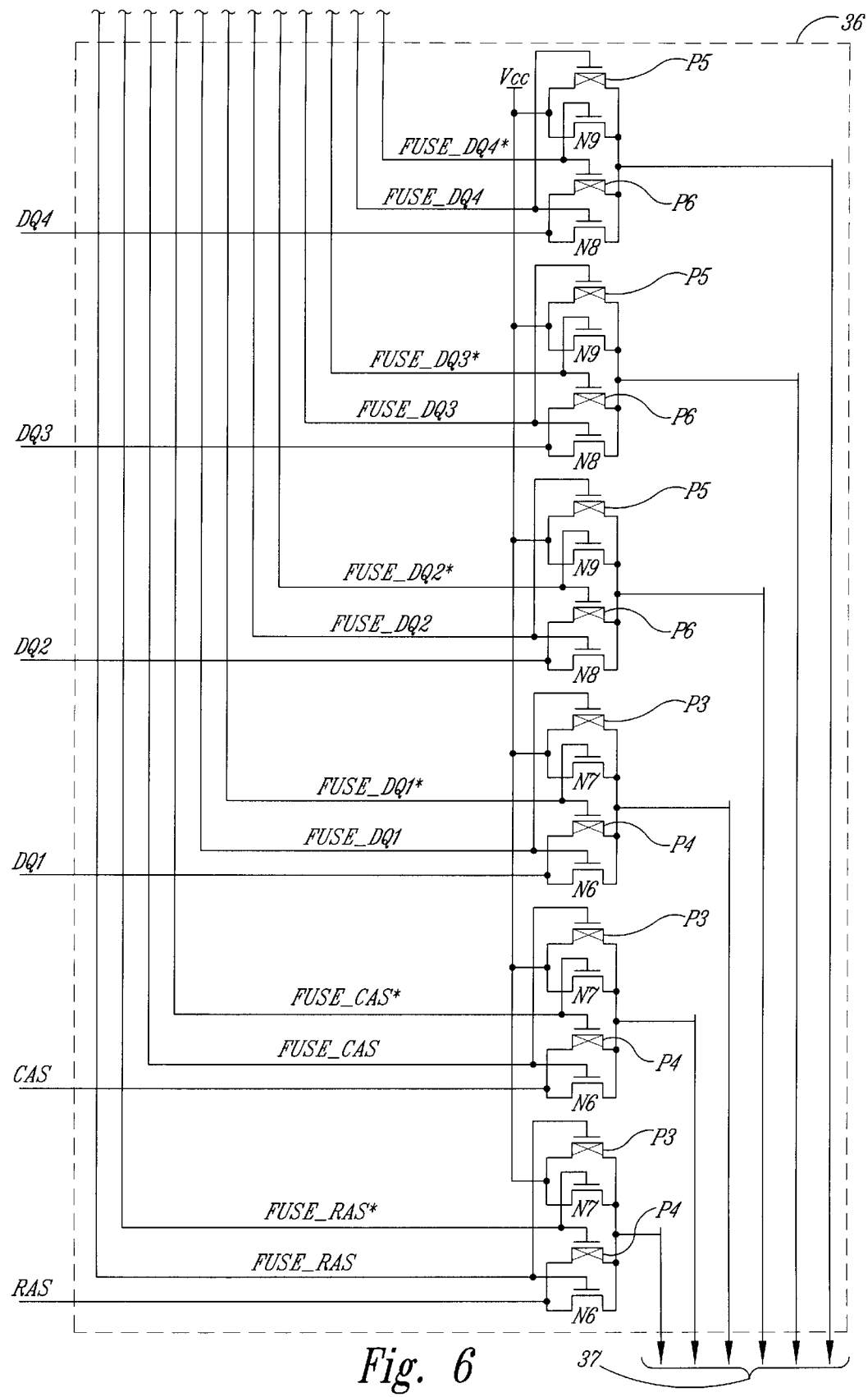
FIG. 6 is a schematic diagram of the pass gates of FIG. 4.

The pass gates 36 of FIG. 4 are shown in more detail in FIG. 6. The high FUSE_RAS, FUSE_CAS and FUSE_DQ1 output signals from the fuse circuits 34 (not shown) turn NMOS transistors N6 on and PMOS transistors P3 off. At the same time, the low FUSE_RAS*, FUSE_CAS* and FUSE_DQ1* output signals from the fuse circuits 34 (not shown) turn NMOS transistors N7 off and PMOS transistors P4 on. With the NMOS transistors N6 and the PMOS transistors P4 on, the RAS, CAS and DQ1 input signals are passed through the pass gates 36 as inputs to the NAND gate 38 (not shown) and as the signals uniquely identifying the integrated memory circuit 20a (not shown).

Conversely, the low FUSE_DQ2, FUSE_DQ3 and FUSE_DQ4 output signals from the fuse circuits 34 (not shown) turn NMOS transistors N8 off and PMOS transistors P5 on. At the same time, the high FUSE_RAS*, FUSE_CAS* and FUSE_DQ1* output signals from the fuse circuits 34 (not shown) turn NMOS transistors N9 on and PMOS transistors P6 off. With the NMOS transistors N9 and the PMOS transistors P5 on, the supply voltage $V_{cc}$ is passed through the pass gates 36 as inputs to the NAND gate 38 (not shown). The input signals DQ2, DQ3 and DQ4 are not passed through the pass gates 36 as inputs to the NAND gate 38 (not shown) because NMOS transistors N8 and PMOS transistors P6 are off. In an alternative embodiment, NMOS transistors N7 and N9 may be omitted.

The present invention thus advantageously provides a circuit and method for enabling a function circuit such as a redundant memory cell in one of the integrated memory circuits in a multiple memory device module. Significantly, the respective function circuit of one of the integrated memory circuits can be enabled without the respective function circuits of the other integrated memory circuits being enabled. The circuit and method also advantageously provide an increased rate of successful repair when used to repair multiple memory device modules with inoperable standard memory cells.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

We claim:

1. An integrated circuit module, comprising:

a plurality of integrated circuits coupled to each other and to an externally accessible connector through a plurality of common conductors, each of the integrated circuits being modified responsive to a programming signal applied to one of the terminals;

a plurality of enable circuits, each of the enable circuits being coupled to a respective integrated circuit to apply an enable signal to the integrated circuit responsive to a set of input signals applied to the terminals that is unique for a first set of the integrated circuits consisting of less than all of the integrated circuits in the module;

a modifying circuit for each of the integrated circuits, the modifying circuit modifying each integrated circuit in the first set responsive to the programming signal only when the integrated circuit has also received its respective enable signal.

2. The integrated circuit module of claim 1 wherein the first set consists of a single integrated circuit.

3. The integrated circuit module of claim 1 wherein each of the integrated circuits comprise a memory device containing a plurality of memory cells arranged in rows and columns.

4. The integrated circuit module of claim 3 wherein the modifying circuit comprises a redundant memory circuit that, when enabled by the enable signal, substitutes a functioning set of memory cells for a defective set of memory cells responsive to the programming signal.

5. In a module containing a plurality of integrated circuits each of which may be coupled to external circuitry through a plurality of externally accessible terminals that are common to a plurality of the integrated circuits, each integrated circuit being modified in accordance with a programming signal applied to one of the terminals, a method of modifying a first set of the integrated circuits in the module responsive to the programming signal without modifying a second set of the integrated circuits in the module responsive to the programming signal, the method comprising:

enabling each of the integrated circuits to respond to the programming signal responsive to a set of input signals applied to the terminals that is unique to the first set of integrated circuits;

applying the set of input signals to the terminals that uniquely corresponding to the integrated circuits in the first set; and applying the programming signal to one of the terminals, thereby causing the integrated circuits in the first set to be modified without modifying the integrated circuits in the second set.

6. The method of claim 5 wherein a single integrated circuit in the module is included in the first set of integrated circuits and the remaining integrated circuits in the module are included in the second set of integrated circuits.

7. The method of claim 5 wherein the step of enabling each of the integrated circuits responsive to the unique set of input signals applied to the terminals comprises, for each of the input signals in the set, programming a respective fuse.

8. The method of claim 5 wherein the step of enabling each of the integrated circuits to respond to the programming signal responsive to the unique set of input signals applied to the terminals comprises, for each of the input signals in the set, programming a respective anti-fuse.

9. The method of claim 5 wherein each of the integrated circuits comprises a memory circuit having an array of memory cells arranged in rows and columns.

10. The method of claim 9 wherein the integrated circuits in the first set is modified by functionally replacing defective memory cells with functional memory cells.

11. In a memory module containing a plurality of memory devices coupled through a bus system, including an address bus, a data bus, and a control bus, to a set of externally accessible terminals, a method of altering a function performed by one of the memory devices without altering a function performed by the other memory devices in the module, the method comprising:

programming each of the memory devices before being placed in the memory module so that they are enabled responsive to a unique set of input signals applied to the integrated circuit;

placing the integrated circuits in the memory module;

applying a set of input signals to the externally accessible terminals so that the input signals are coupled to a plurality of the memory devices through the bus system, the set of input signals uniquely corresponding to one of the memory devices; and applying a programming signal to one of the externally accessible terminals so that the programming signal is coupled to a plurality of the memory devices through the bus system, the programming signal altering a function performed by the memory device uniquely corresponding to the set of input signals applied to the terminals without altering a function performed by the other memory devices in the memory module.

12. The method of claim 11 wherein the programming signal alters a function performed by the memory device by causing the memory device to functionally replace defective memory cells with functional memory cells.

13. The method of claim 11 including the step of applying to a plurality of the terminals respective programming signals to cause the memory device to be modified.

14. The method of claim 11 wherein the step of programming each of the memory devices before being placed in the memory module so that they are enabled responsive to a unique set of input signals applied to the integrated circuit comprises selectively programming a set of programmable impedance elements in a pattern corresponding to the set of input signals that are unique to the memory device, the programmable impedance elements corresponding in number to the number of input signals in the unique set.

15. The method of claim 14 wherein each of the programmable impedance elements comprise a fuse.

16. The method of claim 14 wherein each of the programmable impedance elements comprise an anti-fuse.

17. The method of claim 11 wherein the step of applying the programming signal to the terminal comprises applying a programming voltage to one conductor of the addresses busses through a respective one of the externally accessible terminals, the programming voltage having a magnitude that is larger than the magnitude of address signals that are applied to the address bus through the externally accessible terminals in normal operation.

18. The method of claim 11 wherein the step of applying a set of input signals to the externally accessible terminals comprise applying signals to the data and control busses through the externally accessible terminals.

* * * * *

UNITED STATES PATENT AND TRADEMARK OFFICE
CERTIFICATE OF CORRECTION

PATENT NO. : 5,920,516
DATED : July 6, 1999
INVENTOR(S) : Gilliam et al.

It is certified that error appears in the above-identified patent and that said Letters Patent is hereby corrected as shown below:

| Column | Reads | Should Read |
|---|---|---|
| Column 2, line 40 | "$(0.99^8)$" | -- $(0.99)^8$ -- |
| Column 5, line 11 | "may be 30 selected" | -- may be selected -- |
| Column 6, line 4 | "fuses F4" | -- fuses or antifuses F4" |

Signed and Sealed this

First Day of May, 2001

*Attest:*

NICHOLAS P. GODICI

*Attesting Officer*   *Acting Director of the United States Patent and Trademark Office*